(12) United States Patent
Tada et al.

(10) Patent No.: US 8,796,860 B2
(45) Date of Patent: *Aug. 5, 2014

(54) SEMICONDUCTOR DEVICE

(71) Applicant: Renesas Electronics Corporation, Kawasaki (JP)

(72) Inventors: Yuji Tada, Kawasaki (JP); Tsuyoshi Hirakawa, Kawasaki (JP); Hironori Nakamura, Kawasaki (JP); Takayuki Kurokawa, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/752,219

(22) Filed: Jan. 28, 2013

(65) Prior Publication Data
US 2013/0140717 A1 Jun. 6, 2013

Related U.S. Application Data

(63) Continuation of application No. 13/490,871, filed on Jun. 7, 2012, now Pat. No. 8,436,469, which is a continuation of application No. 12/929,968, filed on Feb. 28, 2011, now Pat. No. 8,237,287.

(30) Foreign Application Priority Data

Mar. 31, 2010 (JP) ................................ 2010-080938

(51) Int. Cl.
*H01L 23/48* (2006.01)
*H01L 23/52* (2006.01)
*H01L 29/40* (2006.01)

(52) U.S. Cl.
USPC .................. 257/776; 257/E23.145; 257/758; 257/774; 438/280; 438/619

(58) Field of Classification Search
CPC ............................................ H01L 2924/01013
USPC .......... 257/E21.627, 409, 422, 508, 758, 773, 257/774, 776; 438/118, 280, 619, 622
See application file for complete search history.

(56) References Cited

U.S. PATENT DOCUMENTS

| 4,663,646 A | 5/1987 | Ikawa et al. ..................... 357/45 |
| 5,350,886 A | 9/1994 | Miyazaki et al. ............. 174/250 |

(Continued)

FOREIGN PATENT DOCUMENTS

| JP | 5-55380 A | 3/1993 |
| JP | 05-55380 A | 3/1993 |

(Continued)

OTHER PUBLICATIONS

Japanese Office Action dated Feb. 27, 2013 with an English translation.

(Continued)

*Primary Examiner* — Chris Chu
(74) *Attorney, Agent, or Firm* — McGinn IP Law Group, PLLC

(57) ABSTRACT

A semiconductor device includes a substrate, a multi-layer wiring layer formed on the substrate, and including a signal line and ground lines extending above the signal line, one of the ground lines extending toward a direction in a layer and another one of the ground lines extending from the one of the ground lines toward another direction in the layer, a first pad on the multi-layer wiring layer, and a redistribution layer formed on the multi-layer wiring layer, including a second pad, a redistribution line coupling the first pad and the second pad, and an insulation film covering the redistribution line.

8 Claims, 5 Drawing Sheets

(56) References Cited

U.S. PATENT DOCUMENTS

| | | | | |
|---|---|---|---|---|
| 5,508,938 | A | 4/1996 | Wheeler | 364/488 |
| 6,002,161 | A * | 12/1999 | Yamazaki | 257/531 |
| 6,484,302 | B1 | 11/2002 | Freymuth | 716/10 |
| 6,501,169 | B1 * | 12/2002 | Aoki et al. | 257/700 |
| 6,611,041 | B2 | 8/2003 | Maeda et al. | 257/531 |
| 6,636,075 | B2 | 10/2003 | Nakayama et al. | 326/102 |
| 6,700,162 | B2 * | 3/2004 | Lin et al. | 257/359 |
| 6,721,933 | B2 | 4/2004 | Iwasa | 716/10 |
| 6,734,472 | B2 | 5/2004 | Ho | 257/207 |
| 6,798,073 | B2 | 9/2004 | Lin et al. | 257/778 |
| 6,846,717 | B2 | 1/2005 | Downey et al. | 438/400 |
| 6,870,256 | B2 * | 3/2005 | Aoki et al. | 257/700 |
| 6,897,507 | B2 | 5/2005 | Lin | 257/300 |
| 6,984,816 | B2 | 1/2006 | Holm et al. | 250/214 R |
| 7,049,676 | B2 | 5/2006 | Tanabe et al. | 257/508 |
| 7,193,311 | B2 | 3/2007 | Ogawa et al. | 257/687 |
| 7,417,317 | B2 * | 8/2008 | Lin et al. | 257/773 |
| 8,436,469 | B2 * | 5/2013 | Tada et al. | 257/758 |

FOREIGN PATENT DOCUMENTS

| | | |
|---|---|---|
| JP | 2005-5741 A | 1/2005 |
| JP | 2009-194022 A | 8/2009 |

OTHER PUBLICATIONS

Chinese Office Action dated Nov. 5, 2013, with English translation.

\* cited by examiner

SEMICONDUCTOR DEVICE

CROSS-REFERENCE TO RELATED APPLICATIONS

The present application is a Continuation Application of U.S. patent application Ser. No. 13/490,871, filed on Jun. 7, 2012, which is a Continuation Application of U.S. patent application Ser. No. 12/929,968, now U.S. Pat. No. 8,237, 287, which is based on and claims priority from Japanese patent application No. 2010-080938, filed on Mar. 31, 2010, the entire contents of which is incorporated herein by reference.

The disclosure of Japanese Patent Application No. 2010-80938 filed on Mar. 31, 2010 including the specification, drawings and abstract is incorporated herein by reference in its entirety.

BACKGROUND

1. Field of the Invention

The present invention relates to a semiconductor device having a redistribution layer.

2. Description of Related Art

System-in-package (SiP) technology for configuring a system of plural semiconductor chips (hereinafter referred to as "chips") sealed in a package has been known. A SiP includes plural ready-made chips stacked or horizontally arranged and sealed in a package. Depending on the arrangement of pads formed on each chip, therefore, routing of wires to be bonded becomes complicated to possibly cause bonded wires to come into mutual contact. To avoid this problem, it sometimes becomes necessary to change pad locations on individual chips before mounting chips for sealing as a SiP.

Redistribution layer (hereinafter referred to as "RDL") technology is among the means of changing pad locations. In RDL technology, a redistribution layer is formed over an existing chip. A redistribution layer includes appropriately located new pads and redistribution lines for coupling pads formed over an existing chip and the new pads. The pads formed over a chip can be appropriately relocated making use of a redistribution layer formed over the chip. There is, however, a problem with this technology. That is, circuits and signal lines formed over the existing chip are adversely affected by electric field noise generated by electric current flowing through the pads and redistribution lines formed over the redistribution layer. Technology for solving the above problem is disclosed in Japanese Unexamined Patent Publication No. 2005-005741.

FIG. 1 is a sectional view of the semiconductor device disclosed in Japanese Unexamined Patent Publication No. 2005-005741. The semiconductor device includes metallic parts 150 formed over the uppermost layer of a multilayer wiring layer 120 formed over a substrate 110 over which capacitors 101 are formed. The multilayer wiring layer 120 includes plural stacked layers each insulated with an interlayer insulation film 130 and a wiring 140 formed over each of the stacked layers. External terminals 400 and redistribution lines 500 are formed over an insulation film 300 which is formed over the multilayer wiring layer 120. Each external terminal 400 is coupled to an electrode 200 of a semiconductor chip 100 by a redistribution line 500.

FIG. 2 is a plan view of the semiconductor device disclosed in Japanese Unexamined Patent Publication No. 2005-005741. Each metallic part 150 is formed in a region not included in any region where a wiring 140 is formed and is positioned upward of a capacitor 101 (or an analog circuit). Each metallic part 150 is electrically coupled to a node 200 kept at a predetermined potential.

In the semiconductor device disclosed in Japanese Unexamined Patent Publication No. 2005-005741, the electric field noise generated by the external terminals 400 and redistribution lines 500 formed over the redistribution layer is shielded by the metallic parts 150. Therefore, the possibility of the capacitors 101 being affected by the electric field noise can be reduced. Also, since the metallic parts 150 can be formed in an existing process of forming the multilayer wiring layer 120, they can be formed without largely increasing the total production processes.

SUMMARY

In the semiconductor device disclosed in Japanese Unexamined Patent Publication No. 2005-005741, however, metal parts are formed along the layout of external terminals and redistribution lines formed over a redistribution layer and, when the layout of external terminals and redistribution lines is changed, the metal parts cannot be correspondingly relocated. Furthermore, each metal part is formed where, over the uppermost layer of a multilayer wiring layer, no signal line for coupling to a circuit is formed. Thus, the layout of metal parts is subjected to restrictions imposed by the layout of multilayer wirings.

Means for solving the above problems will be described below referring to reference numerals used in the following "DETAILED DESCRIPTION OF THE PREFERRED EMBODIMENTS." The reference numerals referred to serve to clarify correspondence between the appended claims and descriptions in the "DETAILED DESCRIPTION OF THE PREFERRED EMBODIMENTS." The reference numerals, however, should not be used for interpretation of a technical scope of the invention defined by the appended claims.

A semiconductor device according to an aspect of the present invention includes a silicon substrate (21) over which a circuit (5) is formed, a multi-layer wiring layer (22) having a plurality of wiring layers (23a to 23c) formed over the silicon substrate (21) and a first pad (4) formed in a predetermined location of an uppermost layer of the wiring layers (23a to 23c), a new pad (2) provided in an appropriate location over the multi-layer wiring layer (22), and a redistribution layer (30) provided with a redistribution line (1) coupling the new pad (2) and the first pad (4). The multi-layer wiring layer (22) includes a signal line (6) for transmitting an electric signal to the circuit (5) and a ground line (3) provided between the redistribution line (1) or the new pad (2) and the circuit (5). The ground line (3) is formed to correspond to a location where the new pad (2) is assumed to be located and a route along which the redistribution line (1) is assumed to be formed. The redistribution line (1) is formed along at least a portion of the ground line (3).

According to the present invention, the layout of signal lines and ground lines is determined by taking into consideration assumed routes of redistribution lines and new pads assumed to be formed over a redistribution layer. Therefore, even when the layout of redistribution lines and new pads is changed, it is possible to deal with the change, so that the layout for the redistribution layer can be designed with increased flexibility. Also, ground lines for shielding electric field noise are not limited to an uppermost part of a multilayer wiring layer. For a multilayer wiring layer, therefore, signal lines and ground lines can be laid out with increased flexibility compared with cases where signal lines and ground lines are limited to an uppermost part of a multilayer wiring layer.

DETAILED DESCRIPTION OF THE PREFERRED EMBODIMENTS

A semiconductor device according to the present invention will be described below with reference to the attached drawings.

First Embodiment

A semiconductor device according to a first embodiment of the present invention will be described below.

Figure 1:
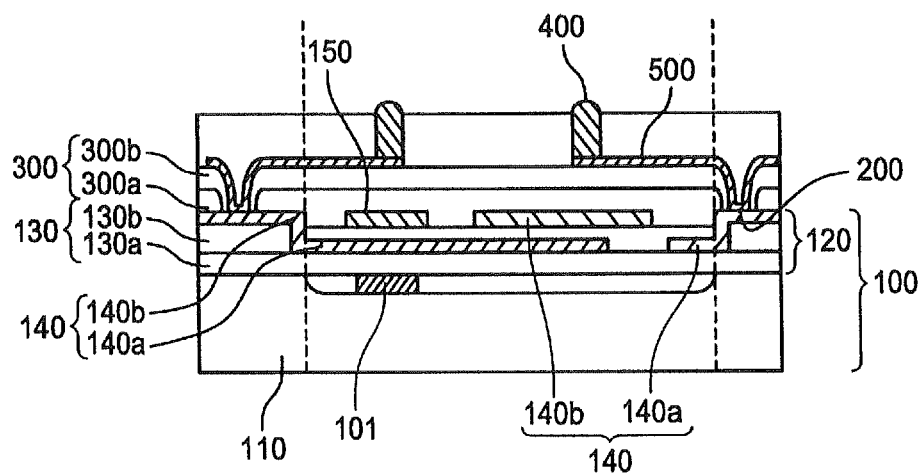
FIG. 1 is a sectional view of the semiconductor device disclosed in Japanese Unexamined Patent Publication No. 2005-005741.
Figure 2:
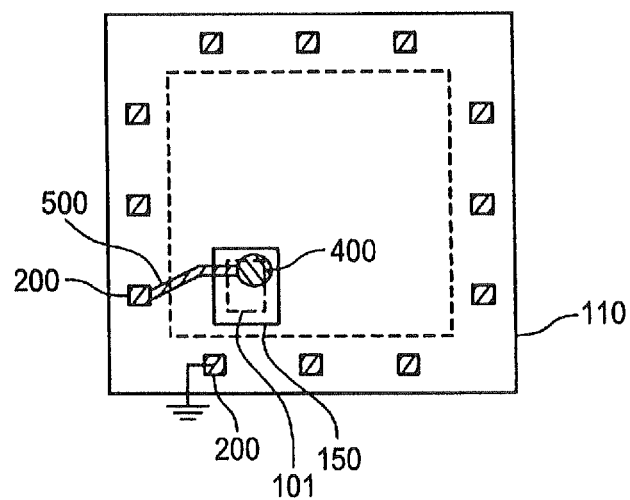
FIG. 2 is a plan view of the semiconductor device disclosed in Japanese Unexamined Patent Publication No. 2005-005741.
Figure 3:
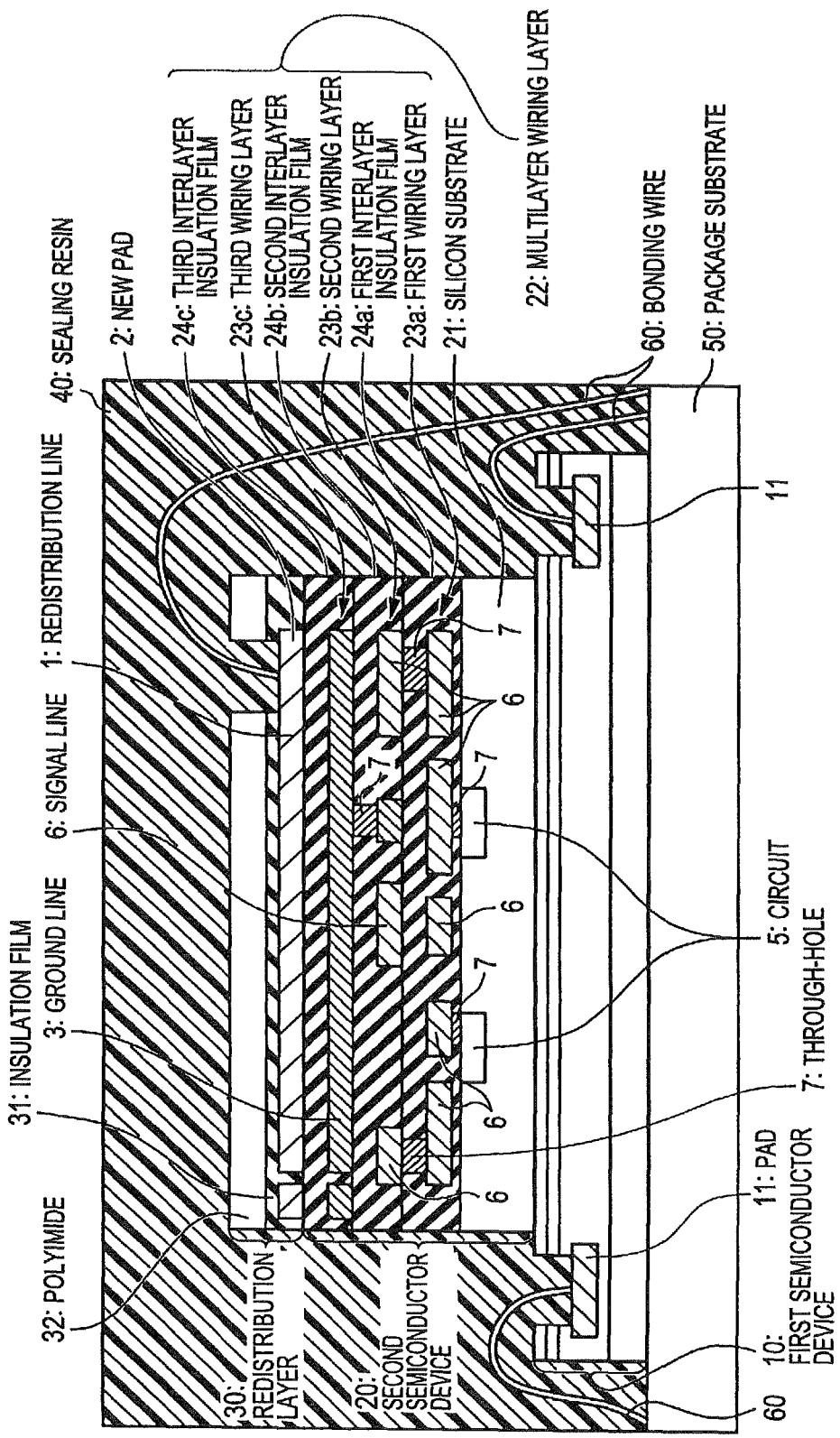
FIG. 3 is a sectional view of a SiP including a semiconductor device according to a first embodiment of the invention.
Figure 4:
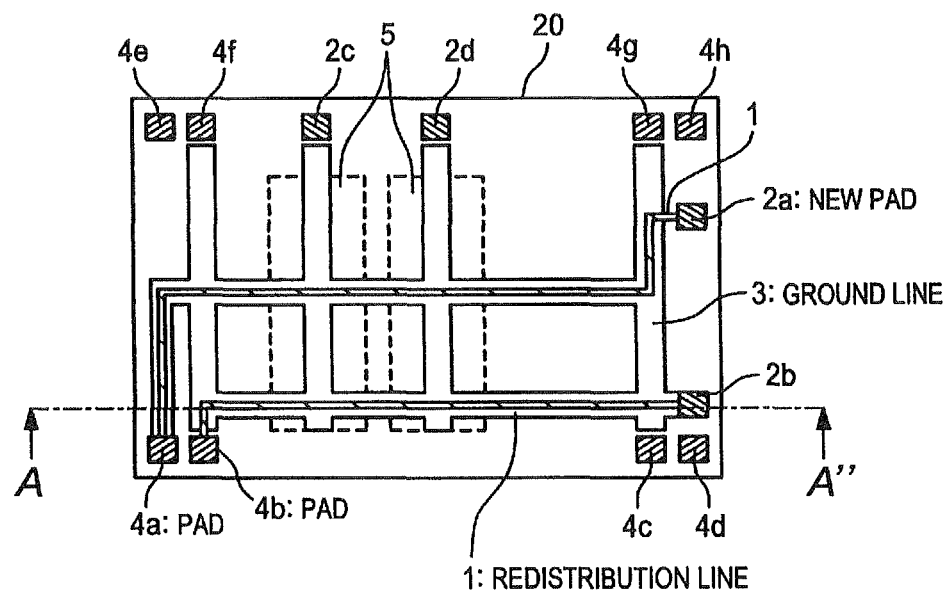
FIG. 4 is a plan view of the semiconductor device according to the first embodiment of the invention.

FIG. 3 is a sectional view, taken along line A-A" in FIG. 4, of a SiP including the semiconductor device according to the first embodiment of the present invention. FIG. 4 is a plan view of the semiconductor device according to the present embodiment.

Referring to FIG. 3, a first semiconductor device 10 (hereinafter referred to as a "semiconductor device 10") is provided over a package substrate 50. A second semiconductor device 20 (hereinafter referred to as a "semiconductor device 20") is provided over the semiconductor device 10. A redistribution layer 30 is formed over the semiconductor device 20. The semiconductor devices 10 and 20 are sealed with a sealing resin 40 and make up a SiP. The configuration in which the semiconductor device 20 is provided over the semiconductor device 10 as shown in FIG. 3 is only an example. The semiconductor devices 10 and 20 may be arranged, for example, side by side over the package substrate 50.

The semiconductor device 20 is provided with a silicon substrate 21. Circuits 5 which may be, for example, transistors, are formed over the silicon substrate 21. A multilayer wiring layer 22 including multiple wiring layers is formed over the silicon substrate 21. Even though, in the present embodiment, the multilayer wiring layer 22 includes three wiring layers, i.e. a first wiring layer 23a, a second wiring layer 23b, and a third wiring layer 23c, the multilayer wiring layer 22 may include more than or fewer than three wiring layers.

Each of the wiring layers includes signal lines 6 of, for example, aluminum (Al) or copper (Cu) and ground lines 3. The signal lines 6 transmit electrical signals used for operations of the circuits 5. The ground lines 3 are coupled to a predetermined ground potential and shield electric field noise generated by the redistribution layer 30. First to third interlayer insulation films 24a to 24c of, for example, silicone dioxide are formed between the wiring layers. The signal lines 6 and ground lines 3 may be intercoupled between different wiring layers via through-holes 7.

The redistribution layer 30 is formed over the semiconductor device 20. Namely, redistribution lines 1 of, for example, aluminum (Al) or copper (Cu) are formed over the third interlayer insulation film 24c formed over the uppermost layer of the multilayer wiring layer 22. An insulation film 31 of silicon dioxide (SiO2) or silicon nitride (SiN) is formed over the redistribution lines 1. The insulation film 31 is covered with polyimide 32. New pads 2 are formed by removing appropriate portions of the insulation film 31 and polyimide 32 over the semiconductor device 20. The redistribution lines 1 electrically couple pads 4 and the new pads 2 formed over the semiconductor device 20.

Of the new pads 2 formed over the redistribution layer 30 and the pads 4 formed over the semiconductor device 20, appropriately located pads 4 are coupled to lead electrodes formed over the package substrate 50 with bonding wires 60. Pads 11 are formed over the semiconductor device 10. The pads 11 are also coupled to lead electrodes formed over the package substrate 50 with bonding wires 60. With the pads 4 formed over the semiconductor device 20 being appropriately relocatable using the new pads 2 formed over the redistribution layer 30, the layout of the bonding wires 60 is prevented from becoming complicated.

The redistribution lines 1 and new pads 2 formed over the redistribution layer 30 generate electric field noise when transmitting electrical signals. The electric field noise adversely affects operations of the circuits 5 and signal lines 6. As a measure against this problem, the ground lines 3 are provided in portions, between the redistribution lines 1 and new pads 2 and the circuits 5 or signal lines 6, of the multilayer wiring layer 22. The ground lines 3 shield electric field noise generated by the redistribution lines 1 and new pads 2 and, thereby, reduce the effects of the electric field noise on the circuits 5 or signal lines 6. In the semiconductor device according to the present embodiment, the ground lines 3 are formed over any one of or plural ones of the wiring layers included in the multilayer wiring layer 22. Therefore, the ground lines 3 can be laid out with increased flexibility without being dependent on the layout of the signal lines 6.

FIG. 4 is a plan view of a configuration of not a specific layer but plural layers of the semiconductor device arranged to show portions required to facilitate the following description.

Referring to FIG. 4, plural pads 4a to 4h are formed on the third wiring layer 23c that is the uppermost layer of the multilayer wiring layer 22 of the semiconductor device 20. Plural new pads 2a to 2d are formed in appropriate locations of the redistribution layer 30. The redistribution lines 1 formed on the redistribution layer 30 couple pads 4 and new pads 2. The circuits 5 are, as described in the foregoing, formed over the silicon substrate 21 of the semiconductor device 20. The ground lines 3 are formed in the multilayer wiring layer 22 of the semiconductor device 20.

According to the present embodiment, the ground lines 3 are formed by taking into consideration assumed locations of new pads 2 assumed to be formed, assumed routes of redistribution lines 1 assumed to be formed to couple the assumed locations of new pads 2 and optional pads 4, and the layout of the circuits 5 and signal lines 6. It must be noted that not all the ground lines 3 laid out have a new pad 2 and a redistribution line 1 formed over them. Namely, the ground lines 3 are deliberately formed in locations where a new pad 2 and a redistribution line 1 are possibly formed.

For example, referring to FIG. 4, a redistribution line 1 is formed between the pad 4a and new pad 2a and also between the pad 4b and new pad 2b. The redistribution lines 1 are formed along and over the correspondingly located ground lines 3, but there are also ground lines 3 formed in locations corresponding to no redistribution line 1.

Referring to FIG. 4, the ground lines 3 are formed to allow a redistribution line 1 to be formed to extend also from pad 4c, 4f, or 4g. Reference numerals 2c and 2d in FIG. 4 represent locations where new pads 2 (2c and 2d) were assumed to be formed, though not realized. Namely, when new pads 2, e.g. 2c and 2d, are assumed to be provided, the ground lines 3 are formed taking into consideration the assumed locations of the new pads 2c and 2d.

A designer when designing the semiconductor device 20 determines the layout of the ground lines 3 and signal lines 6 to be formed in the multilayer wiring layer 22 by taking into consideration the assumed locations and routes of new pads 2 and redistribution lines 1 assumed to be formed over the redistribution layer 30. For example, the ground lines 3 may be laid out in a grid-like pattern allowing pads 4 and new pads 2 to be coupled and the signal lines 6 may be laid out to be outside the area where the ground lines 3 are laid out. This makes it possible, when a layout design for new pads 2 and redistribution lines 1 assumed to be formed is changed, to deal with the change. The ground lines 3 can be formed, as described above, over any one of or some of the wiring layers included in the multilayer wiring layer 22, so that they can be laid out with increased flexibility.

The semiconductor device according to the first embodiment of the present invention has been described above.

Second Embodiment

A semiconductor device according to a second embodiment of the present invention will be described below. The semiconductor device according to the second embodiment differs from that according to the first embodiment in layout of ground lines 3.

Figure 5:
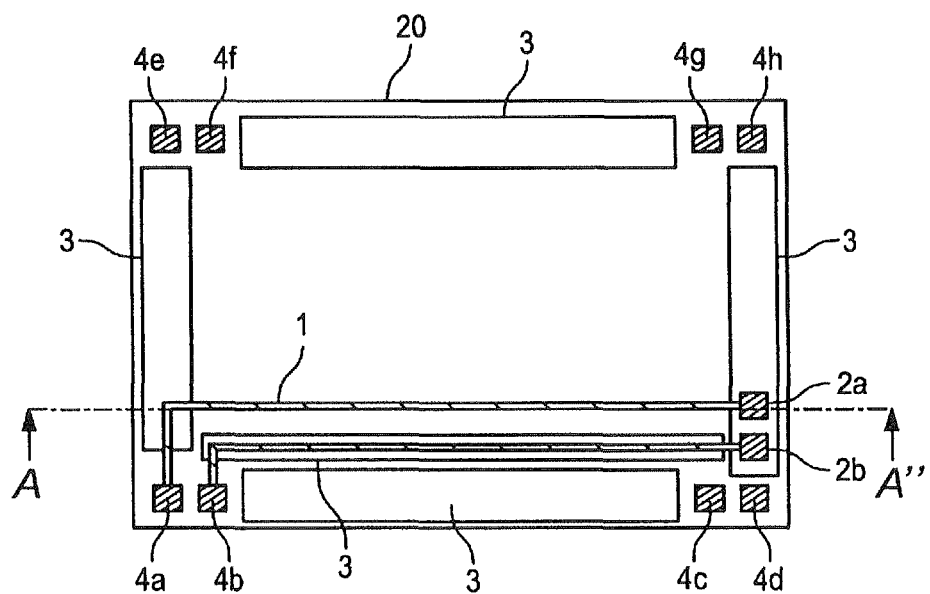
FIG. 5 is a plan view of a semiconductor device according to a second embodiment of the invention.
Figure 6:
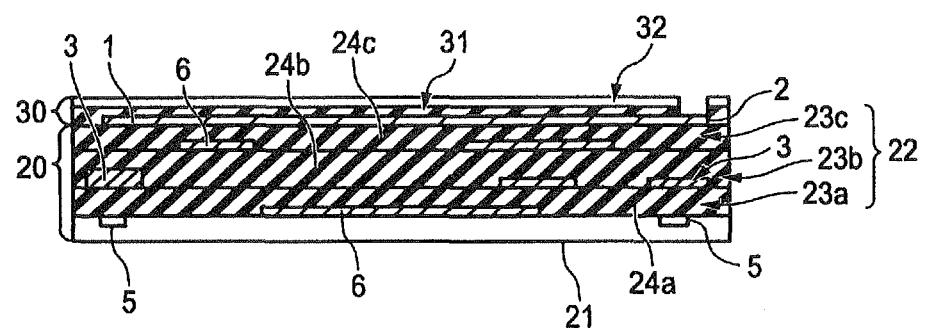
FIG. 6 is a sectional view of the semiconductor device according to the second embodiment of the invention.

FIG. 5 is a plan view of the semiconductor device according to the second embodiment. FIG. 6 is a sectional view, taken along line A-A" in FIG. 5, of the semiconductor device according to the second embodiment of the present invention.

In the semiconductor device 20 shown in FIG. 5, ground lines 3 are laid out along the outer periphery of the semiconductor device 20. This is because new pads 2 are, as exemplified by new pads 2a and 2b, generally arranged near the outer periphery of the semiconductor device 20. With the ground lines 3 laid out along the periphery of the semiconductor device 20, new pads 2 can be located anywhere along the periphery of the semiconductor device 20.

Referring to FIG. 6, the ground lines 3 are formed over the second wiring layer 23b included in the multilayer wiring layer 22. As in the first embodiment, the ground lines 3 may be formed over any one of or some of the plural wiring layers 23a to 23c included in the multilayer wiring layer 22. They may also be formed to extend across the plural wiring layers 23a to 23c. With the ground lines 3 laid out as described above, even when the circuits 5 or signal lines 6 are formed, as shown in FIG. 6, near the periphery of the semiconductor device 20, the electric field noise generated by the new pads 2 can be shielded.

Also, as shown between the pad 4b and the new pad 2b in FIG. 5, laying out a ground line 3 along an assumed route of a redistribution line 1 as in the first embodiment makes it possible to shield the electric field noise generated by the redistribution line 1 between the pad 4b and the new pad 2b. The ground lines 3 may also be laid out in a grid-like pattern as in the first embodiment so that pads 4a to 4h can be coupled to new pads 2.

In connection with both the first and second embodiments, there can be cases where no ground line 3 is formed along the route of a redistribution line 1, for example, between the pad 4a and the new pad 2a as shown in FIG. 5. Such condition occurs, for example, when no circuit 5 and no signal line 6 is formed in a location corresponding to the route of a redistribution line 1 or new pad 2 over the silicon substrate 21. In such a case where no circuit 5 and no signal line 6 which can be affected by electric field noise is formed in a location corresponding to the route or location of a redistribution line 1 or new pad 2, the presence of no ground line 3 over such route or location does not cause any problem. When, for example, circuits 5 or signal lines 6 which can be affected by electric field noise are located to correspond to only a portion of the route or location of any redistribution line 1 or new pad 2, a ground line is required to be formed to shield electric field noise at least from such a portion.

The semiconductor device according to the second embodiment of the present invention has been described above.

Third Embodiment

A semiconductor device according to a third embodiment of the present invention will be described below. The semiconductor device according to the third embodiment differs from those according to the first and second embodiments in layout of ground lines 3.

Figure 7:
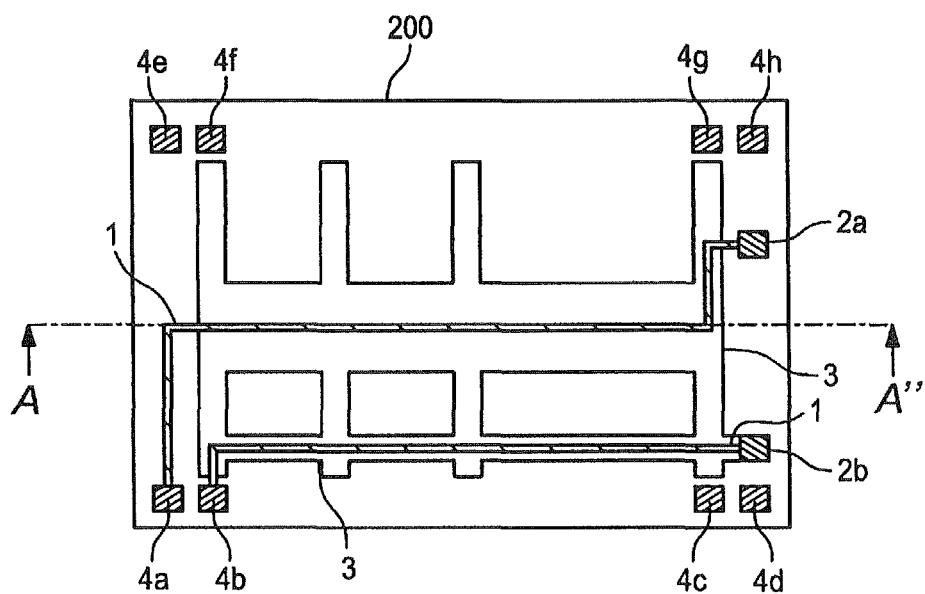
FIG. 7 is a plan view of a semiconductor device according to a third embodiment of the invention.
Figure 8:
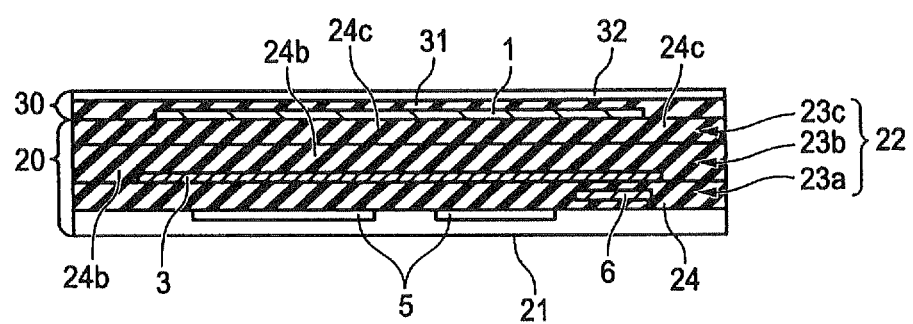
FIG. 8 is a sectional view of the semiconductor device according to the third embodiment of the invention.

FIG. 7 is a plan view of the semiconductor device according to the third embodiment. FIG. 8 is a sectional view, taken along line A-A" in FIG. 7, of the semiconductor device according to the third embodiment of the present invention.

In the third embodiment, as shown in FIG. 7, the portion corresponding to the redistribution line 1 between the pad 4a and the new pad 2a of the ground lines 3 is wider than the corresponding portion of the ground lines 3 of the first embodiment. Normally, when a ground line 3 is formed between a redistribution line 1 or new pad 2 formed over an upper layer and a circuit 5 formed over a lower layer, the ground line 3 is made wider than, that is, larger in area than the redistribution line 1 and new pad 2. Namely, the ground lines 3 are more effective in shielding electric field noise when they are larger in area.

Depending on the positional relationship between redistribution lines 1 formed over an upper layer above the ground lines 3 and circuits 5 and signal lines 6, a large parasitic capacitance is formed between them. Such a large parasitic capacitance can affect the electrical properties of the circuits. To avoid such a problem, when designing the semiconductor device 20, the designer determines the layout of ground lines 3 so as to make the ground lines 3 larger in area by taking into consideration assumed locations of new pads 2 and assumed routes of redistribution lines 1 and also considering the layout of signal lines 6. At this time, the ground lines 3 are made as wide as possible within restrictions related with overall layout and circuit characteristics. This makes it possible to shield electric field noise more effectively.

The semiconductor device according to the third embodiment of the present invention has been described above.

As described above, in the semiconductor device 20 to be provided with a redistribution layer 30, ground lines 3 are formed in locations, of a multilayer wiring layer 22 of the semiconductor device 20, corresponding to the assumed locations and routes of new pads 2 and redistribution lines 1 to be possibly formed over the redistribution layer 30. In this way, even when the locations or routes of new pads 2 or redistribution lines 1 are changed, it is possible to deal with the change.

The ground lines 3 are formed between the new pads 2 and redistribution lines 1 formed over the redistribution layer 30 and the circuits 5 and signal lines 6 formed over the silicon substrate 21 so as to shield electric field noise generated by the new pads 2 and redistribution lines 1. The ground lines 3 are formed over one of the plural wiring layers 23a to 23c of the multilayer wiring layer 22 or across some of the plural wiring layers. The ground lines 3 can therefore be laid out with increased flexibility.

The foregoing embodiments can be carried out whether individually or in combination.

The present invention has been described by way of embodiments, but the invention is not limited to the embodiments. The configuration and details of the invention can be modified in various ways by those skilled in the art without departing from the scope of the invention.

What is claimed is:

1. A semiconductor device, comprising:
    a substrate;
    a multi-layer wiring layer formed on the substrate, and including a signal line and ground lines extending above the signal line, one of the ground lines extending toward a direction in a layer and another one of the ground lines extending from the one of the ground lines toward another direction in said layer;
    a first pad on the multi-layer wiring layer; and
    a redistribution layer formed on the multi-layer wiring layer, including a second pad, a redistribution line coupling the first pad and the second pad, and an insulation film covering the redistribution line.

2. The semiconductor device according to claim 1, wherein the redistribution line extends above the ground lines along the one of the ground lines.

3. The semiconductor device according to claim 2, wherein the insulation film includes a hole exposing the second pad above an end portion of the one of the ground lines.

4. The semiconductor device according to claim 3, wherein the insulation film does not include any of holes above an end portion of the another one of the ground lines.

5. The semiconductor device according to claim 1, wherein the another one of the ground lines extends in a direction perpendicular to the one of the ground lines.

6. The semiconductor device according to claim 1, wherein the one of the ground lines is wider than the another one of the ground lines.

7. The semiconductor device according to claim 1, wherein the another one of the ground lines extends along an outer periphery of the multi-layer wiring layer.

8. The semiconductor device according to claim 1, further comprising a bonding wire coupled to the second pad.

* * * * *